United States Patent [19]
Bonnet et al.

[11] Patent Number: 4,555,640
[45] Date of Patent: Nov. 26, 1985

[54] AUTOMATIC HIGH INSULATION SWITCH

[75] Inventors: Bernard Bonnet, Paris; Roger Bressy, le Plessis Robinson; Jean-Claude Sevaille, Savigny le Temple, all of France

[73] Assignee: Commissariat a l'Energie Atomique, Paris, France

[21] Appl. No.: 511,923

[22] Filed: Jul. 8, 1983

[30] Foreign Application Priority Data

Jul. 9, 1982 [FR] France .................. 82 12115

[51] Int. Cl.$^4$ ............................................. H01H 19/00
[52] U.S. Cl. ............................... 307/115; 307/132 R; 307/140; 318/663; 335/206
[58] Field of Search ........... 307/115, 125, 130, 132 R, 307/140; 318/663; 335/205, 206

[56] References Cited

U.S. PATENT DOCUMENTS

| | | | |
|---|---|---|---|
| 3,660,789 | 4/1972 | Weisenburger | 335/206 |
| 3,867,687 | 2/1975 | Gealt | 318/663 X |
| 4,056,733 | 11/1977 | Prestridge | 307/115 |
| 4,389,627 | 6/1983 | Uesugi et al. | 335/206 |

FOREIGN PATENT DOCUMENTS

| | | |
|---|---|---|
| 1289901 | 2/1969 | Fed. Rep. of Germany ...... 335/206 |
| 1563748 | 6/1970 | Fed. Rep. of Germany . |
| 1923473 | 11/1970 | Fed. Rep. of Germany . |
| 2001667 | 9/1969 | France . |
| 2096102 | 2/1972 | France . |

OTHER PUBLICATIONS

Article by J. Briaud published in Electronique et Application Industrielle, No. 255, Jun. 1978.

*Primary Examiner*—A. D. Pellinen
*Assistant Examiner*—Derek S. Jennings
*Attorney, Agent, or Firm*—Kerkam, Stowell, Kondracki and Clarke

[57] ABSTRACT

Automatic high insulation switch with low consumption level and small overall dimensions. The switch is associated with an apparatus for measuring very low currents ($10^{-7}$ to $10^{-14}$ amperes) comprising an amplifier controlled by an input field effect transistor. The invention aims to switch on the amplifier's very high value resistors with the aid of magnetically controlled, flexible reed interrupters or switches, actuated by a permanent magnet, which is itself controlled by a conventional servomechanism having a motor and a potentiometer controlled by a microprocessor. Other interrupters ensure the protection of the transistor. The invention is more particularly used for measuring currents supplied by ionization chambers.

2 Claims, 2 Drawing Figures

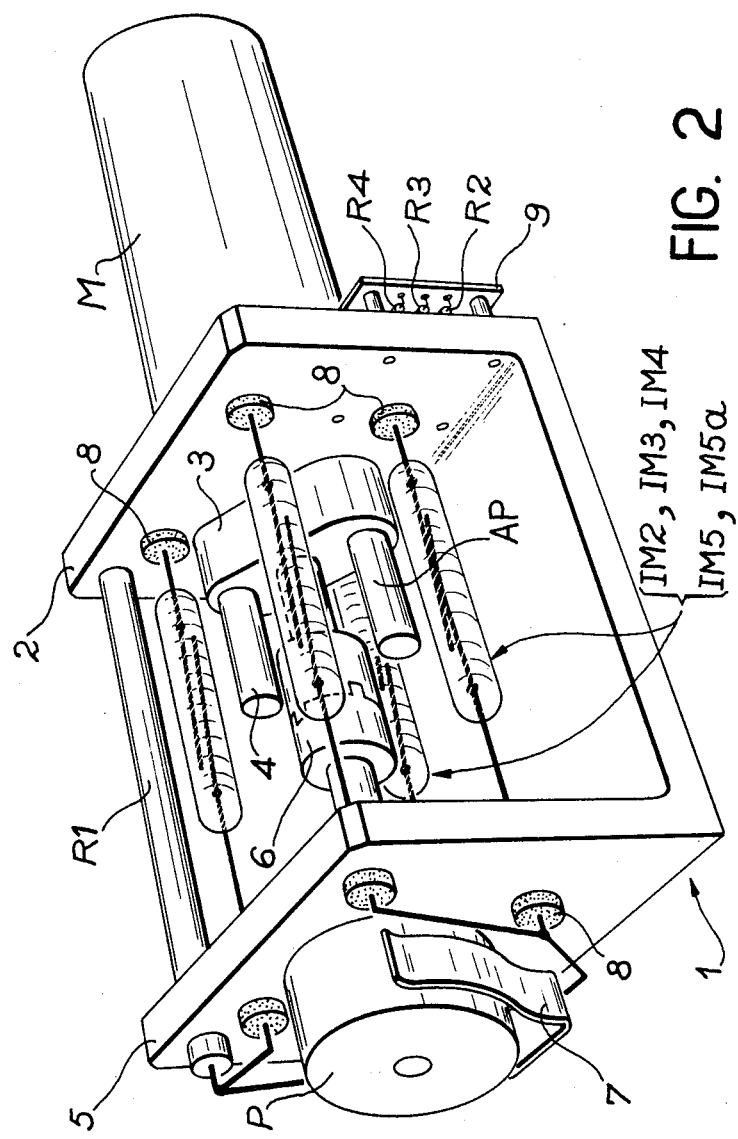

AUTOMATIC HIGH INSULATION SWITCH

BACKGROUND OF THE INVENTION

The present invention relates to an automatic high insulation switch with a low consumption level and small overall dimensions. It relates to the field of the electrical measurement of currents having very low intensities, whose values are spread over several decades and, more specifically, relates to the case where said measurement is performed, in per se known manner, by means of an electrometric apparatus constituted by an integrated amplifier, preceded by at least one field effect transistor, having an insulated gate with a very low leakage current. The transistor-amplifier assembly is negatively fed back linearly by high value resistors, which are switched in accordance with the range of measurements to be performed.

For example, in the case of measuring very low currents with intensities between $10^{-4}$ and $10^{-7}$ amperes, from an ionization chamber, the values for the feedback resistors are then between $10^6$ and $10^{12}$ ohms, as a function of the range of measurement.

The invention more specifically relates to the switching device used for switching these high value resistors and which must have insulation characteristics compatible with these high values. The invention especially relates to known switching devices using magnetically controlled, flexible reed interrupters or switches enclosed in bulbs and known as reed bulbs or ILS interrupters or switches, connected in series with the different high value resistors used for the different ranges of measurement and which close when subject to the action of a magnetic field.

Hitherto, in the known switching devices of a first type, this magnetic field is produced by relays suffering from the disadvantage of having a relatively high consumption, due to their magnetic circuit, which must be imperfectly closed, in order to respect the leakage lines of the bulb switch or interrupter required for insulation purposes.

In the known switching devices of a second type, this magnetic field is produced by a permanent magnet which a manual control device positions in front of the bulb interrupter, whose contact is to be closed. This obviates the aforementioned disadvantage of a permanent high current consumption, but suffers from the disadvantage of using a manual control.

SUMMARY OF THE INVENTION

The object of the invention is to eliminate these two disadvantages, which is particularly necessary when it is wished to have a portable, automatic apparatus for measuring very low currents. In this case, it is necessary for the apparatus to be supplied by batteries and must consequently have a minimum consumption, the ranges of measurement must be automatically switched and the assembly must have a limited weight and overall dimensions.

To this end, the invention relates to an automatic high insulation switch having a low consumption and small overall dimensions, which is to be associated with an electrometric apparatus constituted by an integrated amplifier preceded by at least one field effect transistor with an insulated gate and with a very low leakage current, the transistor-amplifier assembly being linearly negatively fed back by high value resistors switched in accordance with the range of measurements to be performed by flexible reed interrupters magnetically controlled by means of a permanent magnet, wherein it also comprises a per se known servomechanism having a motor and a potentiometer for positioning the permanent magnet in front of one of the magnetically controlled, flexible reed interrupters, means being provided for comparing the output voltage of the amplifier with the voltage supplied by the potentiometer and characterizing the position of said permanent magnet, whilst consequently controlling the magnet displacement motor.

The automatic nature of the switch according to the invention is ensured by the use, in combination therewith, of the servomechanism and its control means, which can be very simply realised with the aid of known means, such as an analog-digital converter and a microprocessor, as will be described in greater detail hereinafter.

The high insulation of the switch results from the use, in series with the high value resistors corresponding to the different ranges of measurement, of magnetically controlled, flexible reed interrupters with a very high insulation, e.g. higher than $10^{14}$ ohms.

The low consumption of the switch results from the fact that the servomechanism motor only consumes power at the instant of a switching operation, whilst its steady current in stable position is zero.

The combination of the means according to the invention permits a very precise positioning of the permanent magnet in each of its stable positions, which permits an optimization of the dimensions of the various components of the switch and consequently an optimum reduction of its overall dimensions, as is required for the construction of a portable device.

Another object of the invention is to completely protect the field effect transistor at the amplifier input, when the apparatus is deenergised. Thus, the insulated gate of this transistor is extremely sensitive to electrical or electrostatic overloads due to temporary voltage variations occurring at the time of energising the measuring apparatus, when the operating conditions have not been so completely established.

Another object of the invention is a switch of the aforementioned type, wherein another magnetically controlled, flexible reed interrupter, in front of which is placed the premanent magnet after stopping the apparatus, ensures the short-circuiting of the transistor-amplifier assembly, when the apparatus is deenergised.

According to another special embodiment of the invention, the magnetically controlled, flexible reed interrupter is associated with another magnetically controlled, flexible reed interrupter for cutting out the power supply of the measuring apparatus in the stop position.

Another object of the invention is to provide a sub-component of the actual measuring apparatus comprising the bulb interrupter, their high value resistors connected in series therewith, as well as the motor and potentiometer of the servomechanism and which is simple, compact and miniaturized.

To this end, the invention also relates to a switch of the aforementioned type, wherein it comprises having a U-shaped profiled body with a base and two parallel facing flanges, a servomechanism motor mounted outside the body on one of the flanges, its shaft passing through an orifice in said flange, a servomechanism potentiometer mounted outside the body on the other flange, its shaft being coaxial to the first shaft and passing through an orifice in said other flange, a flexible coupling mechanically connecting the two aforementioned shafts of the motor and the potentiometer, a rectilinear permanent magnet parallel to the two aforementioned shafts, offcentered with respect to them and rotated by the motor shaft, several magnetically controlled, flexible reed bulb interrupters positioned between the two flanges of the profiled body parallel to the motor shaft and equidistantly with respect thereto and regularly spaced from one another in such a way that, during its rotation, the permanent magnet is successively positioned in front of and in the vicinity of the bulb interrupters for controlling the same, and several high value resistors mounted on one and/or the other of the flanges of the profiled body.

A supplementary advantage of the invention results from this embodiment and is due to the fact that in this way it is possible to obtain an excellent stability of each position of the permanent magnet in either of its possible different positions. This stability is not impaired by impacts and/or vibrations.

BRIEF DESCRIPTION OF THE DRAWINGS

The invention is described in greater detail hereinafter relative to non-limitative embodiments and with reference to the attached drawings, wherein show:

FIG. 2 a perspective view of an advantageous embodiment of the switch of FIG. 1.

DETAILED DESCRIPTION OF THE INVENTION

Figure 1:
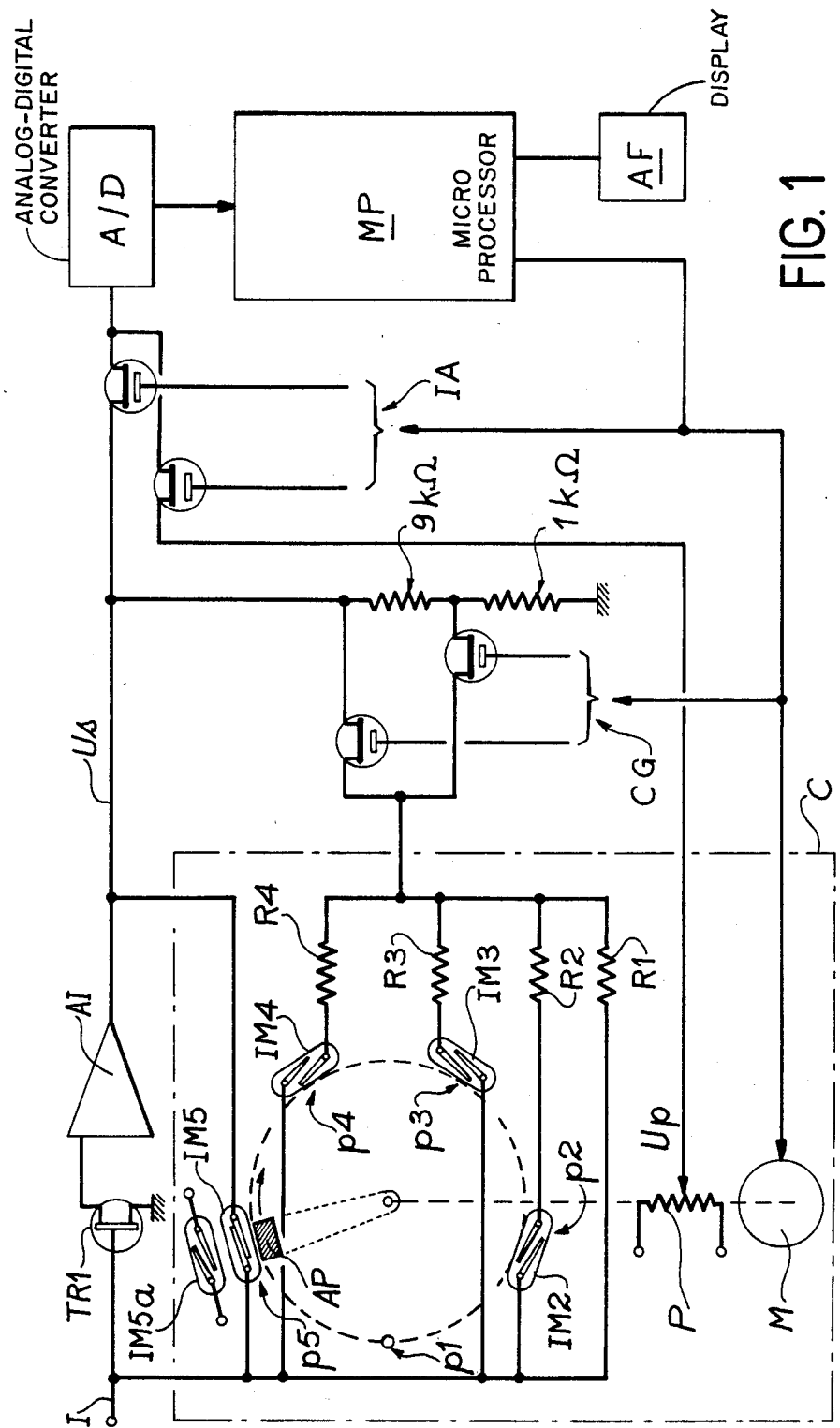
FIG. 1 the electrical and electronic diagram of the switch and its functional control means.

The very low current to be measured of intensity I, coming e.g. from an ionization chamber, is applied to the gate of a MOSFET transistor TR1 preceding an integrated amplifier AI. For example, I varies over 7 decades with intensities of $10^{-14}$ to $10^{-7}$ amperes.

This transistor TR1-amplifier AI assembly is linearly negatively fed back by high value resistors R4, R3, R2, R1 of respective value $10^6$, $10^8$, $10^{10}$ and $10^{12}$ ohms, according to the measuring range.

Resistors R2, R3 and R4 are connected in series with switching elements constituted by magnetically controlled, flexible reed interrupters or switches IM2, IM3 and IM4, such as reed bulbs.

These interrupters are closed by a rotary permanent magnet AP, which is rotated by a motor M of a servomechanism, which also brings about the displacement of the slider of a potentiometer P.

The circular movement of magnet AP is indicated by a broken line circle and the five stable positions which it can occupy are designated p1, p2, p3, p4 and p5.

In position p1, resistor R1 is in feedback of amplifier AI. In position p2, the parallel resistors R1 and R2 are in service. In position p3, the parallel resistors R1 and R3 are in service. In position p4, the parallel resistors R1 and R4 are in service.

In position p5, which corresponds to the position of magnet AP shown in FIG. 1, a switch or interrupter IM5 is closed, short-circuiting the transistor TR1-amplifier AI assembly. This interrupter or switch is duplicated by another interrupter or switch AM5a, which opens under the action of magnet AP and cuts off the general power supply to the electrometric apparatus, as will be explained hereinafter.

The elements forming motor M, potentiometer P, permanent magnet AP, high value resistors R1, R2, R3 and R4 and the magnetically controlled switches or interrupters IM2, IM3, IM4, IM5 and IM5a and shown within the mixed line frame C, constitutes the combination of characteristic means of the switch according to the invention.

This combination of means is controlled by a microprocessor MP, whose essential function is to take account of the output voltage Us of amplifier AI and the voltage Up sampled on the slider of potentiometer P, compare them with reference values stored in the memory, and consequently control the switch control motor M. Micrometer processor MP also controls the display of the measuring range used and the measurement performed in a random known display means AF.

In order to limit the number of high value resistors to be switched, use is made of a gain switching of amplifier AI of 1 and 10, said low impedance switching being carried out by a known type of integrated semiconductor switch CG.

Voltages Us and Up are successively tested with the aid of a known analog switch IA and are digitized by a known analog-digital converter.

The operation of the switch-electrometric apparatus assembly described hereinbefore is as follows.

When the apparatus is in the "stop" position, switch C is in position P5, i.e. amplifier AI is short-circuited and the electric power supply is interrupted by interrupter IM5a and then opened by magnet AP, which faces the same. The way in which this initial situation is obtained will be explained hereinafter.

When the apparatus is placed in the "go" by the manual stop-go switch, microprocessor MP instructs motor M to rotate. Interrupter IM5a is closed and is then in parallel with the manual stop-go switch.

Magnet AP starts operating towards position p4 for optionally measuring the highest current I ($10^{-7}$ amperes) with the lowest value resistor (R4, value $10^6$ ohms, in parallel with R1, value $10^{12}$ ohms).

Microprocessor MP compares the voltage Up on the slider of potentiometer P with the reference value contained in the memory and corresponding to position p4. When these values are equal, motor M is stopped in position p4 and microprocessor MP is switched, by the action of analog interrupter IA, to the output voltage Us of amplifier AI. This output voltage Us is then tested with a gain of 10.

If the value of voltage Us is between 10% 100% of the first range of measurements to which corresponds amplifier AI, fed back by parallel resistors R4 and R1 and with a gain of 10 the switch remains in this first measuring position p4.

If the voltage value Us is below 10% of the aforementioned measuring range, the gain switch CG passes from gain 10 to gain 1 and the microprocessor MP instructs motor M to move permanent magnet AP from position p4 to positon p3.

If the value of voltage Us is then between 10% and 100% of the second range of measurements to which corresponds the amplifier AI fed back by parallel resistors R3 and R1 and with a gain of 1, the switch remains in this new measuring position p3.

If the value of voltage Us is below 10% of the second measuring range, the microprocessor MP instructs the gain switch CG to pass from gain 1 to gain 10.

The same operating cycle as described hereinbefore is then carried out for passing from position p3 to position p2 and then to position p1.

Thus, the microprocessor permanently monitors voltage Us. If the latter increases and passes beyond the top of the measuring range, the microprocessor gives the order to switch to the higher measuring range (whilst switching the gain from 1 to 10 and switching to the resistor with the immediately lower value). If it drops below 10% of the measuring range, the microprocessor gives the order to switch to the lower measuring range (switching the gain from 10 to 1 and switching to the resistor with the immediately higher value).

On discontinuing the use of the apparatus and when the operator has placed it in the "stop" position, the microprocessor gives motor M the instruction to rotate to position p5. The apparatus remains energized by interrupter IM5a, which remains closed for as long as magnet AP has not reached said position p5. When it reaches this position, there is a cutting off of the power supply and the short-circuiting of the transistor TR1-amplifier AI assembly by closing interrupter IM5. This places switch C in the safety position to protect transistor TR1, during the following energizing of the apparatus.

Reference will now be made to FIG. 2 for describing a special embodiment of the switch according to the invention. The mechanical construction and choice of components have been made with the aim at obtaining a simple and compact assembly.

The basic structure is a U-shaped body 1 formed from a standard aluminium shaped section. Motor M is mounted on one of the flanges 2 of said body and its shaft passes through an orifice therein. This shaft is integral with a rotary aluminium support 3, which carries magnet AP and a diametrically facing balancing counterweight 4.

Potentiometer P is coaxially mounted on the other shaft 5 of body 1. An Oldham coupling 6 couples the shafts of motor M and potentiometer P. Potentiometer P is kept in position by clips 7.

The magnetically controlled, flexible reed interrupters IM2, IM3, IM4, IM5 and IM5a are mounted between the flanges 2 and 5 of the body and are arranged parallel and equidistantly of the geometrical axis of the switch. Permanent magnet AP is arranged parallel to the axis of the switch, so that it can be positioned in the vicinity of and parallel to one or other of the flexible reed interrupters. The latter are insulated from the shaped body by crossmembers 8 made from an insulating material, such as polytetrafluoroethylene, known under the trade name Teflon.

The high value resistors R2, R3 and R4 are wired between the insulating crossmembers 8 and an insulating plate 9, on the low potential side, and mounted on small posts. The largest resistotr R1 is mounted with insulation between the two flanges 2 and 5 of the shaped body.

The overall dimensions of this assembly are 70×45×30 mm, so that it is a very compact switch.

The invention is not limited to the embodiments described hereinbefore and in fact numerous different measuring ranges and current values can be used.

What is claimed is:

1. A high insulation automatic switch with a low consumption level and small overall dimensions, which is to be associated with an electrometric apparatus constituted by an integrated amplifier, preceded by at least one field effect transistor having an insulated gate and a very low leakage current, the transistor-amplifier assembly being linearly negatively fed back by high value resistors, switched in accordance with the range of measurements to be used by flexible reed interrupters or switches and magnetically controlled by a permanent magnet, wherein the high insulation automatic switch also comprises a servomechanism with a motor and a potentiometer for positioning the permanent magnet facing one of the magnetically controlled, flexible reed interrupters, means being provided for comparing the output voltage of the amplifier and the voltage supplied by the potentiometer with reference values characterizing the position of the permanent magnet and consequently controlling the motor, wherein another magnetically controlled, flexible reed switch, facing which is positioned the permanent magnet stopping the apparatus, ensures the short-circuiting of the transistor-amplifier assembly, when the apparatus is deenergised, and wherein the other magnetically controlled, flexible reed interrupter is associated with another magnetically controlled, flexible reed interrupter for cutting off the power supply to the measuring apparatus in the stop position.

2. A high insulation automatic switch with a low consumption level and small overall dimensions, which is to be associated with an electrometric apparatus constituted by an integrated amplifier, preceded by at least one field effect transistor having an insulated gate and a very low leakage current, the transistor-amplifier assembly being linearly negatively fed back by high value resistors, switched in accordance with the range of measurements to be used by flexible reed interrupters or switches and magnetically controlled by a permanent magnet, wherein the high insulation automatic switch also comprises a servomechanism with a motor and a potentiometer for positioning the permanent magnet facing one of the magnetically controlled, flexible reed interrupters, means being provided for comparing the output voltage of the amplifier and the voltage supplied by the potentiometer with reference values characterizing the position of the permanent magnet and consequently controlling the motor, and wherein said switch comprises a U-shaped profiled body with a base and two parallel facing flanges, a servomechanism motor mounted outside the body on one of the flanges, a shaft of the servomechanism motor passing through an orifice in said flange, a servomechanism potentiometer mounted outside the body on the other flange, a shaft for the servomechanism potentiometer being coaxial to the servomechanism motor shaft and passing through an orifice in said other flange, a flexible coupling mechanically connecting the two aforementioned shafts of the motor and the potentiometer, a rectilinear permanent magnet parallel to the two aforementioned shafts, offcentered with respect to them and rotated by the motor shaft, several magnetically controlled, flexible reed bulb interrupters positioned between the two flanges of the profiled body parallel to the motor shaft and equidistantly with respect thereto and regularly spaced from one another in such a way that, during its rotation, the permanent magnet is successively positioned in front of and in the vicinity of the bulb interrupters for controlling the bulb interrupters, and several high value resistors mounted on one and/or the other of the flanges of the profiled body.

* * * * *